United States Patent [19]

Backes et al.

[11] Patent Number: 4,464,773
[45] Date of Patent: Aug. 7, 1984

[54] DYNAMIC SYNCHRONOUS BINARY COUNTER WITH STAGES OF IDENTICAL DESIGN

[75] Inventors: Reiner Backes, Freiburg; Friedrich Schmidtpott, Gundelfingen; Mathew Neal, Freiburg, all of Fed. Rep. of Germany

[73] Assignee: ITT Industries, Inc., New York, N.Y.

[21] Appl. No.: 380,791

[22] Filed: May 21, 1982

[30] Foreign Application Priority Data

Jun. 12, 1981 [EP] European Pat. Off. .......... 81-200648

[51] Int. Cl.³ ..................... H03K 21/06; H03K 21/34; H03K 23/22
[52] U.S. Cl. .................................. 377/116; 377/104; 377/123
[58] Field of Search ................ 377/115, 116, 123, 104

[56] References Cited

U.S. PATENT DOCUMENTS 3,284,645 11/1966 Eichelberger et al. ............. 377/116
3,437,832  4/1969 Kopetski ........................... 377/123
4,150,305  4/1979 Streit et al. ......................... 377/116

Primary Examiner—John S. Heyman
Attorney, Agent, or Firm—James B. Raden; Donald J. Lenkszus

[57] ABSTRACT

A first variant using conventional ratio-type two-phase design with nonoverlapping clock signals consists of a first inverter (I1), a complex gate (KG), a first transfer transistor (T1), a second inverter (I2), and a third inverter (I3) connected in series with respect to the signal flow. The complex gate (KG) consists of two NORed AND elements (U1, U2). The output of the second inverter (I2) is the count-up output (VA), and that of the third inverter (I3) is the count-down output (RA). The count-up output (VA) is coupled through a second transfer transistor (T3), controlled by the second clock signal (F2), to the first input of the first AND element (U1), whose second input is connected to the output of the first inverter (I1). The count-down output (RA) is coupled through a third transfer transistor (T2), controlled by the second clock signal (F2), to the first input of the second AND element (U2), whose second input is connected to the output of the NOR gate (NG) through a fourth transfer transistor (T5), which is also controlled by the second clock signal (F2). One of the two inputs of the NOR gate is connected to the carry input (UE) in each stage. The carry input (UE) is connected to the carry output (UA) of the stage through a carry transfer transistor (UT). The carry input (UE) of the least significant stage is grounded. The second input of the NOR gate (NG) is connected to a stop line (S). The carry output (UA) is connected to a constant voltage (U) through a transfer transistor (T4) controlled by the countdown output (RA).

In a second variant, the complex gate (KG) is omitted, so that the output of the first inverter (I1') is connected directly to the input of the second inverter (I2') through the first transfer transistor (T1'). The output of the NOR gate (NG') controls the gate of the second transfer transistor (T2'). Its first input is fed with the first clock signal (F1'), and its second input is connected to the carry input (UE). Those ends of the current paths of the second and third transfer transistors (T2', T3') not connected to the outputs are coupled to the input of the inverter (I1').

4 Claims, 5 Drawing Figures

DYNAMIC SYNCHRONOUS BINARY COUNTER WITH STAGES OF IDENTICAL DESIGN

BACKGROUND OF THE INVENTION

The present invention relates to dynamic synchronous binary counters with ratio-type stages of identical design which are implemented with insulated-gate field-effect transistors and operated with two clock signals, cf. the preambles of the two independent claims 1 and 2. The features contained therein are known from German Offenlegungsschrift No. DE 28 46 957 A1, FIG. 2. Although this is not specifically indicated there, it can be assumed that the clock signals used there are the known nonoverlapping clock signals of the ratio-type two-phase design of integrated circuits implemented with insulated-gate field-effect transistors; see, for example, the journal "The Electronic Engineer", March 1970, pages 56 to 61.

In the prior art arrangement disclosed in the above Offenlegungsschrift, the two clock signals are used only in the least significant stage, while in the respective following stages, the first clock signal is the output signal of the carry transfer transistor. Thus, as the number of stages increases, the frequency of the second clock signal controlling the respective stage decreases in accordance with the associated power of two. From this it follows that the possible total number of stages is limited, for a minimum clock-signal frequency is necessary for dynamic operation. The inventors consider that, in the present state of the art, only about eight-stage synchronous binary counters are likely to be realizable with the known arrangement.

SUMMARY OF THE INVENTION

The invention as claimed is intended to remedy this drawback. Its object is to provide dynamic synchronous binary counters wherein there is no limitation on the possible number of stages.

The invention will now be explained in more detail with reference to the accompanying drawings, in which:

DETAILED DESCRIPTION OF THE DRAWING

Figure 1:
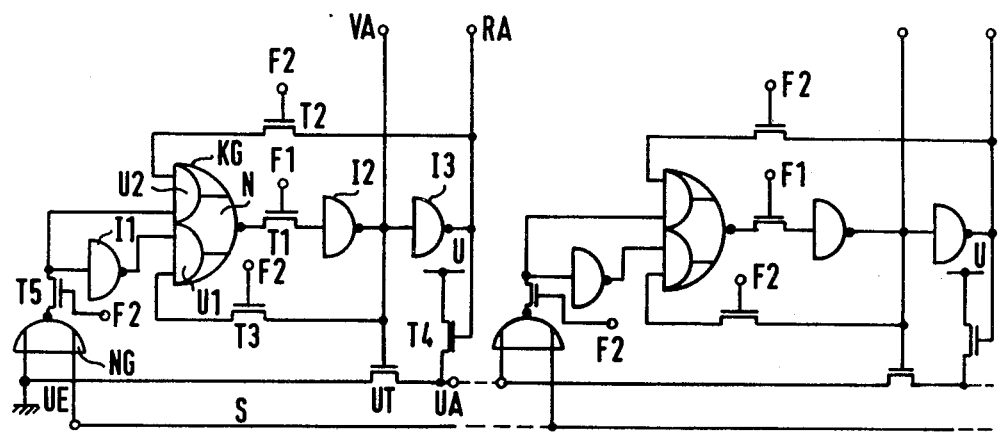
FIG. 1 is a partly schematic circuit diagram of an embodiment of the first variant of the solution.

As an embodiment of the first variant of the solution in accordance with the invention, FIG. 1 shows a partly schematic diagram of two stages whose series connection is indicated by dashed lines. The left-hand stage, in which all components are provided with reference characters, is the least significant stage, which does not differ in design from the other stages, as assumed hereinabove, but its external wiring has a special feature in that its carry input UE is grounded, while the carry inputs of the other stages are connected to the carry output of the respective preceding stage.

In FIG. 1, an individual stage consists of the NOR gate NG, the complex gate KG, which contains the two AND elements U1, U2, whose output signals are processed via the NOR element N, and of the three inverters I1, I2, I3, the five transfer transistors T1, T2, T3, T4, T5, and the carry transfer transistor UT.

The first input of the NOR gate NG is connected to the carry input UE, and the second input is connected to the stop line S, over which the synchronous binary counter can be stopped by application of the more positive level, H, of two binary-signal levels. The output of the NOR gate NG is coupled to the input of the first inverter I1 and to the second input of the AND element U2 of the complex gate KG via the controlled current path of fifth transfer transistor T5, which is controlled by the second clock signal F2.

At this point it should be noted that, for the purposes of the description of the present invention, a distinction is made between "gate" and "logic element". By "gates" are understood insulated-gate field-effect transistor basic logic circuits which have a load resistor of their own; to indicate this, the dot commonly used to denote that inversion occurs is placed at the output point of the logic symbol. By contrast, "logic elements" are only parts of "gates" and, in particular, have no such load resistor of their own.

The output of the first inverter I1 is coupled to the second input of the first AND element U1 of the complex gate KG, while the first input of this AND element U1 is connected to the count-up output VA via the current path of the third transfer transistor T3, which is controlled by the second clock signal F2. Similarly, the first input of the second AND element U2 is connected to the count-down output RA via the current path of the second transfer transistor T2, which is controlled by the second clock signal.

The output of the complex gate KG is connected via the current path of the first transfer transistor T1, which is controlled by the first clock signal F1, to the input of the second inverter I2, whose output is coupled to the input of the third inverter I3 and forms the count-up output VA, and to the gate of the carry transfer transistor UT, which has its controlled current path inserted between the carry input UE and the carry output UA. The output of the third inverter I3 forms the count-down output RA, which is coupled to the gate of the fourth transfer transistor T4, which connects the carry output UA to the fixed voltage U through its controlled current path.

If counters of the design shown in FIG. 1 are operated as up-counters, their count-up outputs VA must be used; if they are operated as down-counters, their count-down outputs RA must be used. Like in conventional ratio-type two-phase circuit technology, the two clock signals F1, F2 are nonoverlapping clock signals, as shown schematically in FIG. 2.

If positive logic is used in the embodiment of FIG. 1, and if the circuit is implemented with n-channel enhancement-mode transistors, the counting process can be stopped by applying an H level to the stop line S. Transistors driven with H levels are then turned on.

The principal advantages of the first variant of the solution are that high clock frequencies can be permitted, and that all stages are operated with these high-frequency clock signals. Furthermore, all H levels are not more than the gate-source threshold voltage of a transistor below the constant voltage U.

Figure 3:
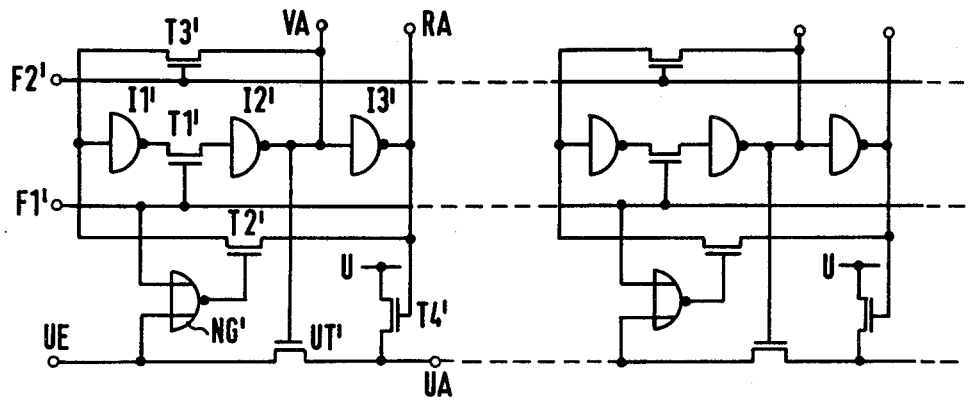
FIG. 3 is a partly schematic circuit diagram of an embodiment of the second variant of the solution.

FIG. 3 shows the circuit diagram of an embodiment of the second variant of the solution according to the invention. Two stages of a synchronous binary counter are again shown to be connected in series, with the left-hand stage, which is provided with reference characters, being the least significant stage. In the latter, the carry input UE is either grounded, in which case a counting process is taking place, or connected to the fixed voltage U, whereby the counting is interrupted or stopped. This changeover can, of course, also be effected by conventional electronic means.

The circuit of a stage in accordance with the second variant shown in FIG. 3 differs from the circuit of a stage as shown in FIG. 1 essentially in that the complex gate KG of FIG. 1 is no longer present, so that the first inverter I1' of FIG. 3 is connected to the input of the second inverter I2' via the transfer transistor T1', which is controlled by the first clock signal F1'. Furthermore, the second input of the NOR gate NG' is not connected to the stop line S of FIG. 1, which is not present in the second variant shown in FIG. 3, but it is controlled by the first clock signal F1'. Otherwise, the circuit of each stage of the variant of FIG. 3 corresponds to that of FIG. 1; to make it easier to distinguish the individual parts of the circuit from those of FIG. 1, however, they are designated by reference characters provided with a prime, i.e., in FIGS. 1 and 3, reference characters with and without a prime correspond to each other.

Figure 2:
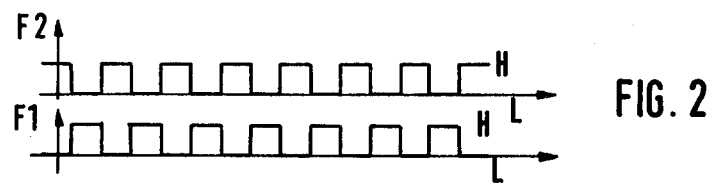
FIG. 2 shows the waveforms of the two clock signals necessary for the arrangement of FIG. 1.
Figure 5:
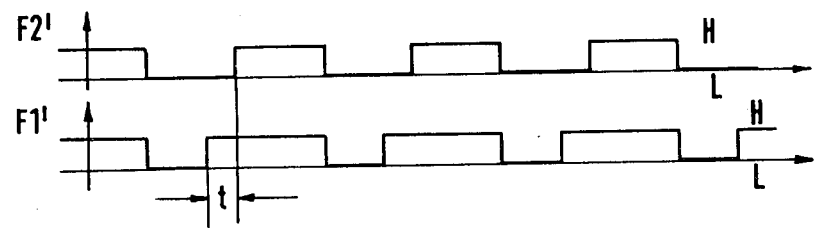
FIG. 5 shows the waveforms of the two clock signals necessary in the arrangements of FIGS. 3 and 4.

The variant of FIG. 3 also differs from that of FIG. 1 essentially in that it must be operated not with nonoverlapping clock signals as shown in FIG. 2, but with clock signals as shown in FIG. 5. While the nonoverlapping clock signals of FIG. 2 can be derived from a square-wavesignal by inversion and subsequent pulse shaping, as is described, for example, in German Offenlegungsschrift No. DE 26 03 704 A1, the clock signals F1', F2' overlap in such a way that their trailing edges are synchronous, while the leading edge of the second clock signal is delayed with respect to that of the first clock signal by a time interval t at least equal to the propagation delay of the second inverter I2'. This inverter propagation delay depends on the layout of the inverter circuit on the chip, which is determined in particular by the input capacitances of the stages controlled by the output of the inverter. As shown in FIG. 5, the two clock signals F1', F2' overlap in such a way that they can be obtaind, for example, by inverting a square-wave signal in two series-connected inverters. In this manner, one will generally also be on the safe side as far as the minimum delay t is concerned.

Figure 4:
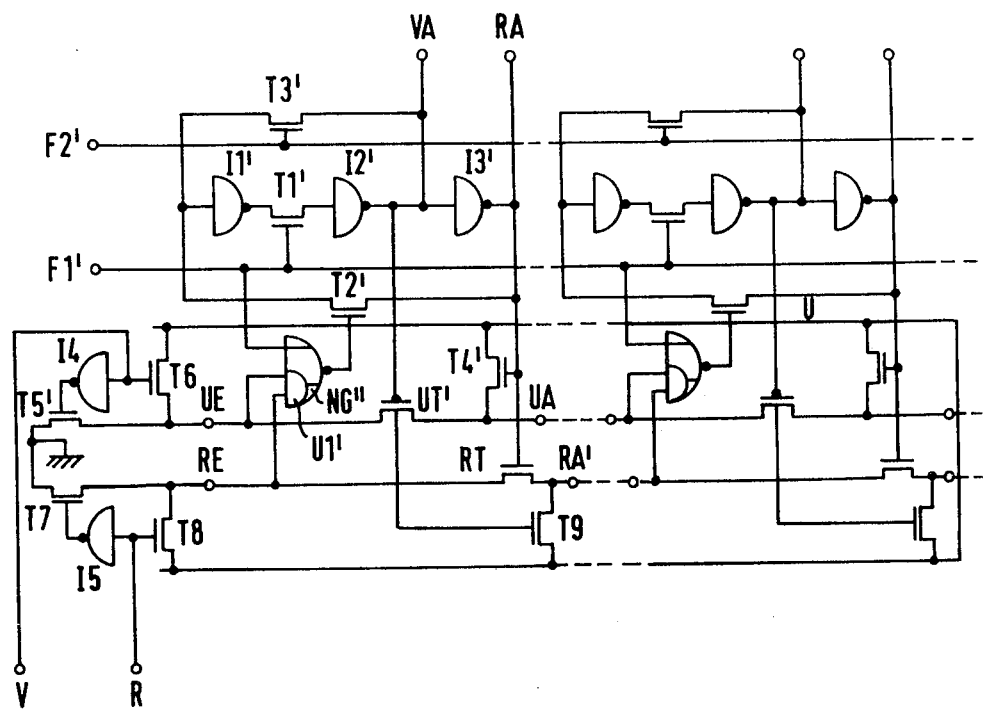
FIG. 4 shows a development of the arrangement of FIG. 3 for up-down counters.

Although in the second variant (FIG. 3), too, it is possible in principle to operate the synchronous binary counter as an up-counter by using the count-up outputs VA, and as a down-counter by using the count-down outputs RA, it may be necessary in certain applications to permit changeover between forward and backward counting. Of course, this can be done in both variants by providing a changeover facility for all count-up and -down inputs. If such counters have large numbers of stages, however, this may be economically prohibitive. FIG. 4, therefore, shows another way of switching a counter as shown in FIG. 3 from forward to backward counting.

In FIG. 4, the NOR gate NG' of FIG. 3 contains the AND element U1', which is associated with the first input of the gate. The arrangement further includes the additional carry transfer transistor RT, whose current path controlled by the count-down output RA is inserted between the additional carry input RE and the additional carry output RA.

The first input of the AND element U1' is connected to the carry input UE, and the second input is connected to the additional carry input RE.

In the embodiment of FIG. 4, the carry input UE of the least significant stage is grounded through the controlled current path of the fifth transfer transistor T5' and connected to the constant voltage U through the current path of the sixth transfer transistor T6, which is controlled by the "up" control signal V. This control signal V is also applied to the input of the fourth inverter I4, whose output is coupled to the gate of the fifth transfer transistor T5'.

Similarly, the additional carry input RE is grounded through the controlled current path of the seventh transfer transistor T7 and connected to the constant voltage U through the eighth transfer transistor T8. The "down" control signal R is applied to the gate of this transfer transistor T8 and to the input of the fifth inverter I5, whose output is coupled to the gate of the seventh transfer transistor T7.

The additional carry output RA' is connected to the constant voltage U through the current path of the ninth transfer transistor T9, which is controlled by the count-up output VA. To select the appropriate direction of count, the associated control signal V, R must assume the more negative level, L, of two binary-signal levels, while the other must be at H level.

Using the additional inverters I4, I5 and the additional transfer transistor T5', T6, T7, T8 in the least significant stage and the additional transfer transistors RT, T9 to be provided in each stage, the embodiment of FIG. 4 thus permits changeover from forward to backward counting by simpler means than if the aforementioned changeover of the count-up or count-down outputs VA, RA were effected. In the embodiment of FIG. 4, one of the two outputs VA, RA can be dispensed with, because both in the "up" mode and in the "down" mode, the signals can be taken from the count-up output VA or, in complementary form, from the count-down output RA.

One of the advantages of the second variant shown in FIG. 2 and of the embodiment of FIG. 4 is that the H states of the clock signals F1', F2' can be arbitrarily long, so that even low-frequency signals can be counted; furthermore, the variant of FIG. 2 and the embodiment of FIG. 4 eliminate the need for differentiating the signal to be counted and synchronizing it to the higher frequency of the clock signals of the counter, as is necessary in conventional synchronous counters. In these arrangements, too, all H levels are not more than the value of the gate-source threshold voltage below the constant voltage U.

The synchronous binary counters according to the invention can be implemented with both p-channel and n-channel enhancement-mode transistors. In the latter case it is particularly advantageous to use depletion-mode transistors for the load devices, because the H levels are then lower than the constant voltage U only by the value of the transistor threshold voltage.

It is also possible to realize the circuit principle underlying the invention with complementary field-effect transistors, i.e., using so-called CMOS technology. The transfer transistors must then be replaced by CMOS transmission gates.

We claim:

1. A dynamic synchronous binary counter having at least two ratio-type stages of identical design which are implemented with insulated-gate field-effect transistors and are operated with two clock signals (F1, F2), each of said stages comprising:
first, second, and third inverters (I1, I2, I3);
first, second, third and fourth transfer transistors (T1 to T4);
at least one carry transfer transistor (UT); wherein
the second and third inverters (I2, I3) are connected directly in series, their node being a count-up output (VA), and the output of the third inverter (I3) being a count-down output (RA);
the count-up output (VA) is coupled to the gate of the carry transfer transistor (UT);
the input of the second inverter (I2) is preceded by the current path of the first transfer transistor (T1), which is controlled by the first clock signal (F1);
the current path of the second transfer transistor (T2), which is controlled by the second clock signal (F2), is connected to the count-down output (RA);
the third transfer transistor (T3) is controlled by the second clock signal (F2);
each of said stages further comprising:
a carry input (UE) and a carry output (UA) coupled together by the current path of the carry transfer transistor (UT), the carry input (UE) of the least significant stage being connected to ground;
a NOR gate (NG) having a first input connected to the carry input (UE), and a second input connected to a stop line (S);
a complex gate (KG) comprising first and second NORed AND elements (U1, U2) and having an output coupled to the input of the second inverter (I2) through the current path of the first transfer transistor (T1), wherein
the count-up output (VA) is coupled through the current path of the third transfer transistor (T3) to a first input of the first AND element (U1), whose second input is connected to the output of the first inverter (I1), and
the carry output (UA) is connected to a constant voltage (U) through the controlled current path of the fourth transfer transistor (T4), whose gate is connected to the count-down output (RA), and
the count-down output (RA) is coupled through the current path of the second transfer transistor (T2) to the first input of the second AND element (U2), whose second input, together with the input of the first inverter (I1), is connected to the output of the NOR gate (NG) through a fifth transfer transistor (T5), which is controlled by the second clock signal (F2), and
the clock signals (F1, F2) are nonoverlapping two-phase clock signals as are used in the prior art.

2. A dynamic synchronous binary counter having at least two ratio-type stages of identical design which are implemented with insulated-gate field-effect transistors and are operated with two clock signals (F1', F2'), each of said stages comprising:
first, second, and third inverters (I1', I2', I3');
first, second, third and fourth transfer transistors (T1' to T4');
at least one carry transfer transistor (UT'); wherein
the second and third inverters (I2', I3') are connected directly in series, their node being a count-up output (VA), and the output of the third inverter (I3') being a count-down output (RA);
the count-up output (VA) is coupled to the gate of the carry transfer transistor (UT');
the output of the first inverter (I1') is coupled to the input of the second inverter (I2') through the current path of the first transfer transistor (T1'), which is controlled by the first clock signal (F1'), and the input of the first inverter (I1') is connected to the count-down output (RA) through the current path of the second transfer transistor (T2');
the third transfer transistor (T3') is controlled by the second clock signal (F2');
each of said stages further comprising:
a carry input (UE) and a carry output (UA) coupled together by the controlled current path of the carry transfer transistor (UT');
the carry input (UE) of the least significant stage being grounded during counting, and connected to a constant voltage (U) when no counting takes place;
a NOR gate (NG') having a first input connected to the carry input (UE), a second input being controlled by the first clock signal (F1'), and its output coupled to the gate of the second transfer transistor (T2'); wherein
the count-up output (VA) is coupled to the input of the first inverter (I1') through the controlled current path of the third transfer transistor (T3'); and
the carry output (UA) is connected to the constant voltage (U) through the controlled current path of the fourth transfer transistor (T4'), whose gate is connected to the count-down output (RA); and
the second clock signal (F2') is derived from the first clock signal (F1') in such a way that the two trailing edges are synchronous, while the leading edge of the second clock signal (F2') is delayed with respect to that of the first (F1') by a period (t) at least equal to the propagation delay of the second inverter (I2').

3. A synchronous binary counter as claimed in claim 2 and used as an up-down counter, further comprising:
an AND element (U1') associated with the first input of the NOR gate (NG");
an additional carry transfer transistor (RT) is provided for backward counting whose current path controlled by the count-down output (RA) is inserted between an additional carry input (RE) and an additional carry output (RA');
the first input of the AND element (U1) is connected to the carry input (UE), and its second input is connected to the additional carry input (RE);
the carry input (UE) of the least significant stage is grounded through the controlled current path of a fifth transfer transistor (T5') and connected to the constant voltage (U) through the controlled current path of a sixth transfer transistor (T6), the gate of the fifth transfer transistor (T5') being controlled by the output of a fourth inverter (I4), whose input, together with the gate of the sixth transfer transistor (T6), is fed with the "up" control signal (V);
the additional carry input (RE) of the least significant stage is grounded through the controlled current path of a seventh transfer transistor (T7) and connected to the constant voltage (U) through the controlled current path of an eighth transfer transistor (T8), the gate of the seventh transfer transistor (T7) being controlled by the output of a fifth inverter (I5), whose input, together with the gate of the eighth transfer transistor (T8), is fed with the "down" control signal (R), and the additional carry output (RA') is connected to the constant voltage (U) through the current path of a ninth transfer transistor (T9), which is controlled by the count-up output (VA).

4. A synchronous binary counter as claimed in any one of claims 1 to 3, wherein all transistors are n-channel enhancement-mode transistors, and that the load resistors of inverters and gates are n-channel depletion-mode transistors.

* * * * *